United States Patent [19]
Shrinkle

[11] Patent Number: 6,107,945
[45] Date of Patent: Aug. 22, 2000

[54] CORRELATED SAMPLED AREA DETECTOR

[75] Inventor: Louis Joseph Shrinkle, Leucadia, Calif.

[73] Assignee: Seagate Technology, Inc., Scotts Valley, Calif.

[21] Appl. No.: 09/097,786

[22] Filed: Jun. 15, 1998

Related U.S. Application Data

[60] Provisional application No. 60/048,941, Jun. 16, 1997, and provisional application No. 60/048,934, Jun. 16, 1997.

[51] Int. Cl.$^7$ .................................................. H03M 5/10
[52] U.S. Cl. ............................................... 341/54; 360/51
[58] Field of Search ................................. 341/50, 51, 54, 341/58; 360/51, 66, 61, 32

[56] References Cited

U.S. PATENT DOCUMENTS

| | | | |
|---|---|---|---|
| 4,492,990 | 1/1985 | Johnson | 360/32 |
| 4,819,103 | 4/1989 | Okamura | 360/51 |
| 5,867,342 | 2/1999 | Hattori | 360/77.08 |

*Primary Examiner*—Brian Young
*Attorney, Agent, or Firm*—Shawn B. Dempster; Edward P. Heller, III

[57] ABSTRACT

A data capture circuit includes a character detection circuit and a word detection circuit. The character detection circuit determines values for characters represented by a signal having a frequency. In making such determinations, the values for characters are based on an accumulation of differential samples of the signal. The word detection circuit is coupled to receive the values for characters from the character detection circuit. The word detection circuit determines a word value based on the received values for characters. The word detection circuit includes a comparison circuit and an accumulator. The comparison circuit compares a value for a character in a word to a to a value for at least one other character in the word and provides a character value based on the comparison. The accumulator has an input coupled to receive character values from the comparison circuit and an output to provide a summation of character values received by the accumulator.

20 Claims, 15 Drawing Sheets

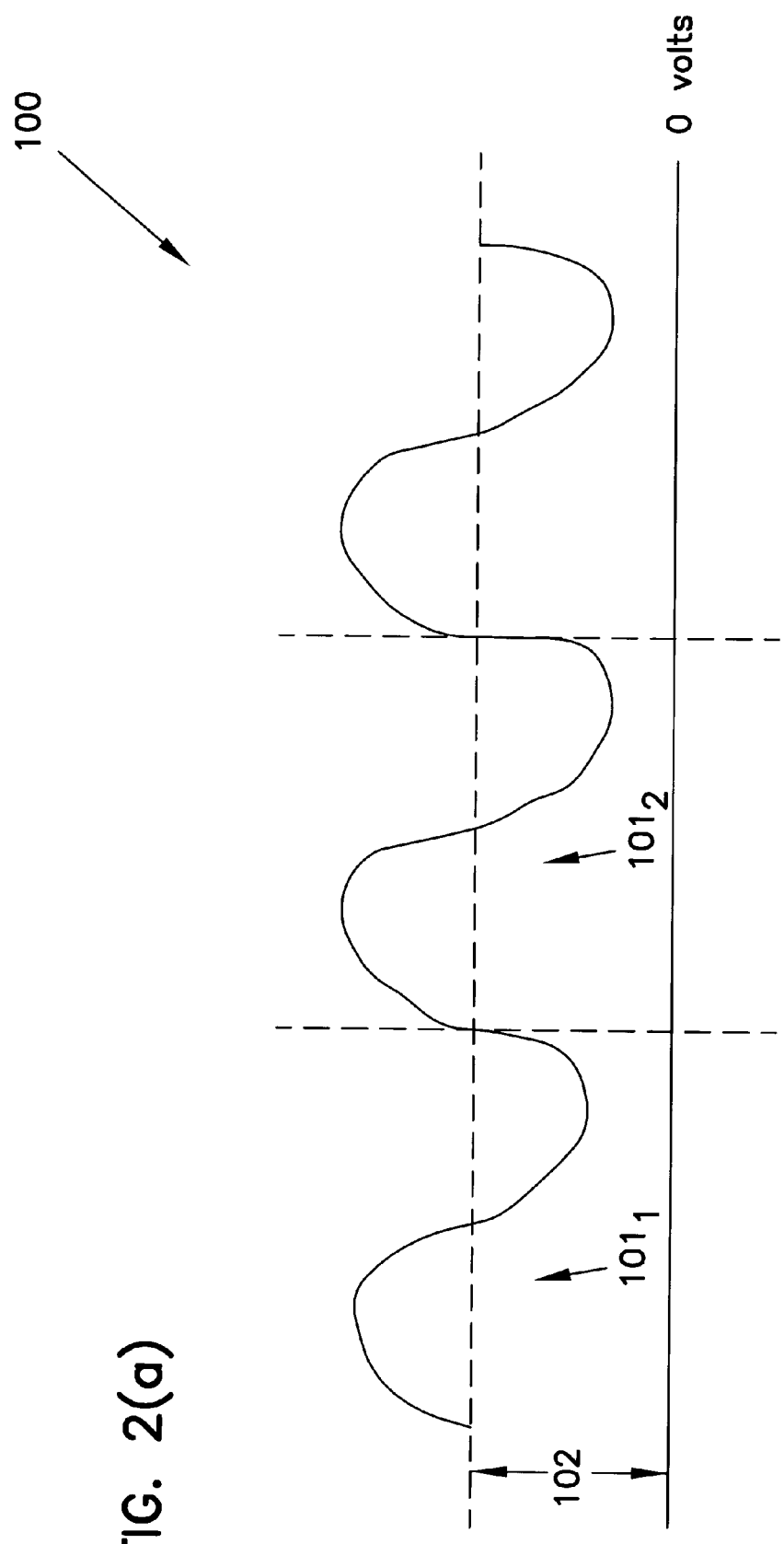

CORRELATED SAMPLED AREA DETECTOR

CROSS-REFERENCE TO RELATED APPLICATIONS

This application claims the benefit of U.S. Provisional Application Ser. No. 60/048,941, filed on Jun. 16, 1997, and U.S. Provisional Application Ser. No. 60/048,934, filed on Jun. 16, 1997.

BACKGROUND OF THE INVENTION

A. Field of the Invention

The present invention is directed toward the field of data capture and area detection circuitry. More particularly, the present invention is directed toward the field of data capture and area detection circuitry for use in disk drive servo channels.

B. Description of the Related Art

When performing data capture operations based on the area detection of an incoming signal, data capture inaccuracies are caused by DC shifts and dropouts that occur in the incoming signal. One example of a system in which DC shifts and signal dropout cause data capture inaccuracies is a disk drive.

In a disk drive, servo signals are written into servo fields on the tracks of a recording medium. The servo signals identify the track on which they are written and the location of the servo signals on the track. This information is used during the operation of a disk drive to record and retrieve data and position the head.

Typically, servo signals are stored on a recording medium as periodic signals having amplitude and frequency, such as a sine wave. FIG. 1 illustrates a sine wave 100 in which each cycle represents a character $101_{1-3}$. The value for each character $101_{1-3}$ is represented by the total area under a rectified sine wave for a cycle corresponding to the character $101_{1-3}$. A servo signal word is represented by the sum of the area values for a set of characters.

In determining the value for a character $101_{1-3}$, a traditional character detection circuit first takes amplitude samples of points on a sine wave 100 cycle corresponding to the character $101_{1-3}$. The character detection circuit then sums the absolute value of each amplitude sample to obtain a character value. A traditional word detection circuit receives the character values and accumulates them to obtain a word value.

When a servo signal experiences a DC shift, the character value determined by a traditional character detection circuit is incorrect. In a disk drive, there are two major sources of DC shift. One source is the magneto-resistive heads that are employed for exchanging data with the recording medium. Another cause is thermal asperities, which occur when the spacing between a disk drive's recording medium and read-write head falls below a certain threshold.

FIG. 2($a$) illustrates the servo signal sine wave 100 shown in FIG. 1 having a DC shift 102. Using a traditional character detection circuit, the magnitude of the shift 102 is added into every sample of the sine wave cycle. As a result, the character value is inflated by an amount equal to the number of amplitude samples multiplied by the magnitude of the DC shift 102.

When a servo signal experience a dropout, the resulting character value will cause the word value to be incorrect. Dropouts are often caused in a disk drive by defects in the recording medium. FIG. 2($b$) illustrates the servo signal sine wave 100 from FIG. 1 having a dropout 103 in the second character $101_2$. The dropout 103 will cause a character detection circuit to provide a character value that is substantially less than the desired character value. As a result, the word value, which is derived from a sum of character values, will be significantly attenuated.

Accordingly, it is desirable for a data capture circuit to compensate for DC shifts that occur in signals. It is also desirable for compensation to be provided for the occurrence of signal dropout.

SUMMARY OF THE INVENTION

In accordance with the present invention, a data capture circuit is provided that compensates for DC shifts and dropouts when determining word values. Such a data capture circuit includes a character detection circuit and a word detection circuit. The character detection circuit determines values for characters represented by a signal having a frequency. These character values are based on an accumulation of differential samples of the signal. The use of the differential samples negates the affects of any DC shift in the signal.

The word detection circuit is coupled to the character detection circuit to receive the character values. Based on the received character values, the word detection circuit determines a word value. In determining the word value, the word detection circuit compares each value for a character in a word to a value for at least one other character in the word. Based on the comparison, the word detection circuit determines whether the present character value is valid or distorted by dropout.

If a distortion is detected, the word detection circuit uses another character value in the word in place of the distorted character value. If there is no distortion, then no character value substitution is performed. After corrections are made for dropout distortions, the received character values are accumulated to obtain a word value.

BRIEF DESCRIPTION OF THE DRAWINGS

Further details of the present invention are explained with the help of the attached drawings in which:

FIG. 2($b$) illustrates a set of characters represented by a sine wave having a dropout.

FIG. 7($b$) illustrates the absolute value accumulator shown in FIG. 6 in one embodiment of the present invention.

FIG. 7($c$) illustrates the peak detector shown in FIG. 6 in one embodiment of the present invention.

DETAILED DESCRIPTION

Figure 3:
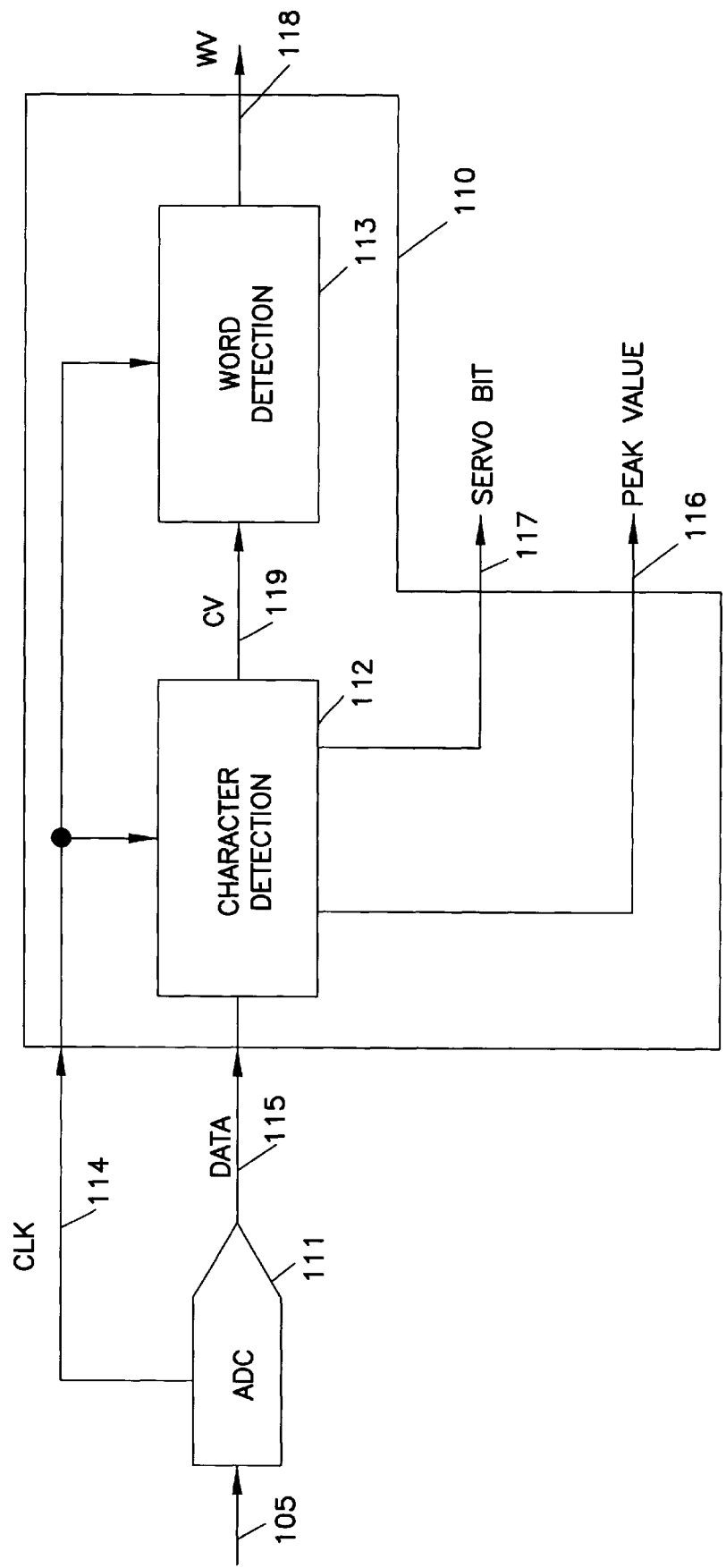
FIG. 3 illustrates a data capture circuit in accordance with the present invention.

FIG. 3 illustrates a data capture circuit 110 in accordance with the present invention. The data capture circuit 110 provides for determining both word and character values based on an incoming set of signal samples. In order to provide for the accurate detection of both characters and words, the data capture circuit 110 compensates for the affect of DC shifts and dropouts on the incoming signal samples. In one embodiment of the present invention, the data capture circuit 110 is employed in a disk drive for interpreting servo signals.

Figure 1:
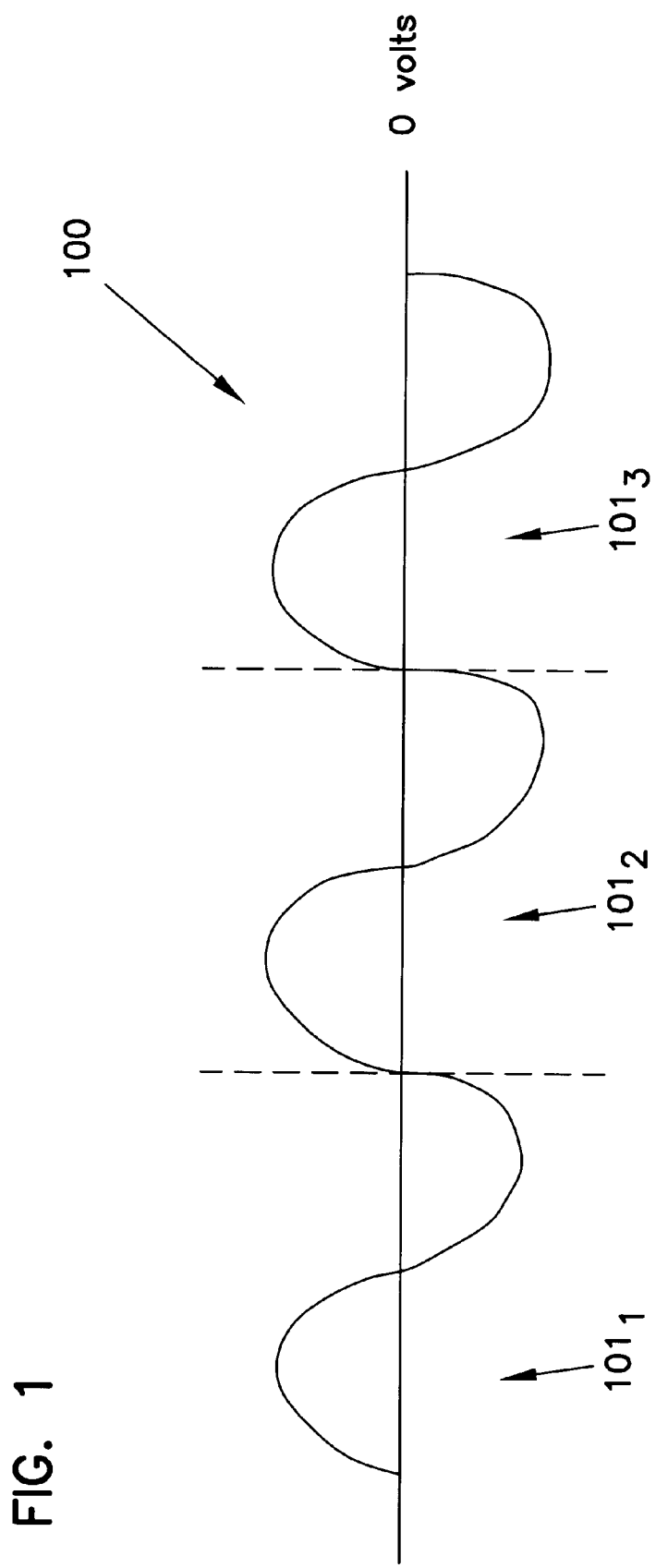
FIG. 1 illustrates a set of characters represented by a sine wave.
Figure 2B:
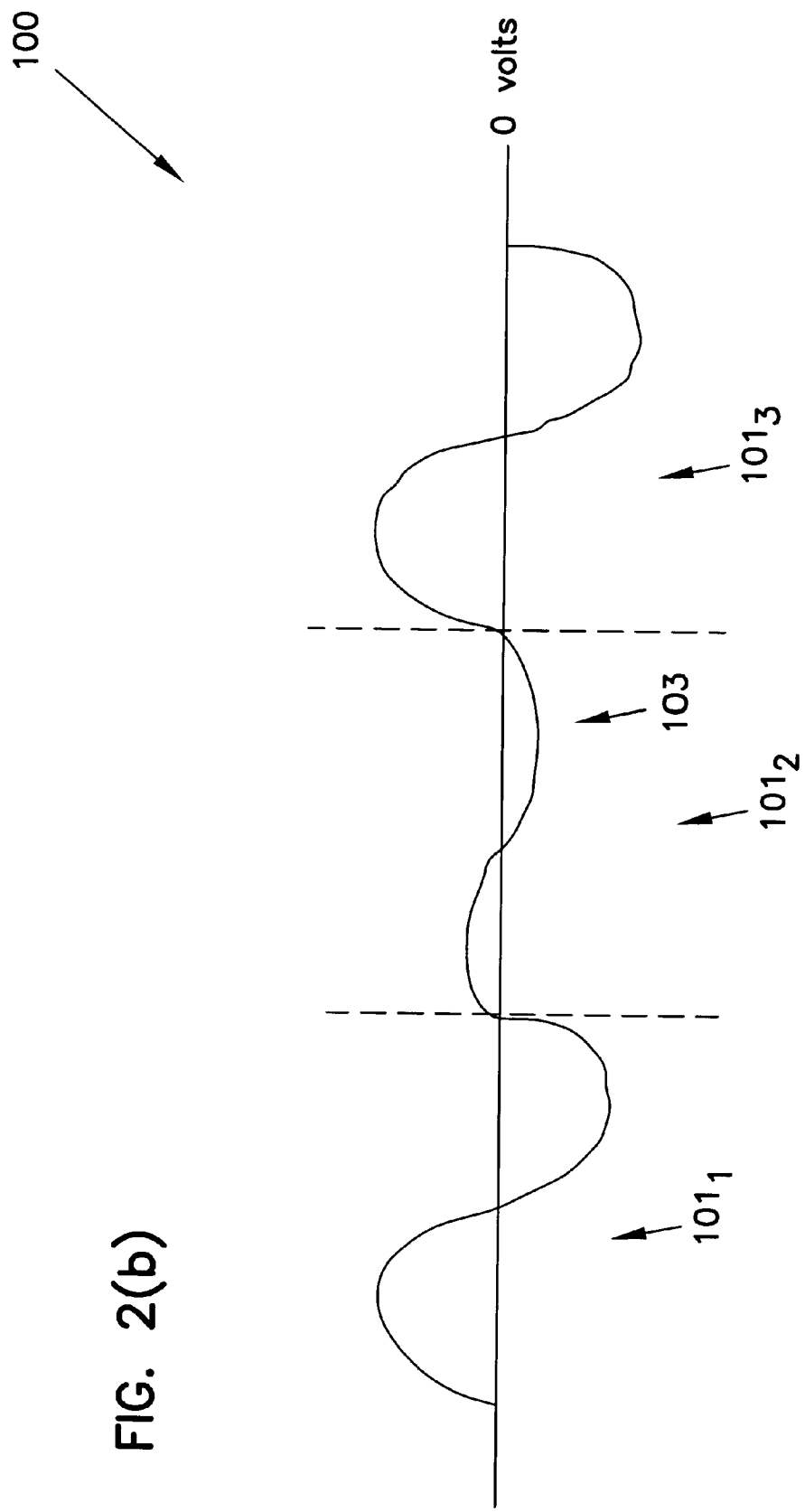
FIG. 2($a$) illustrates a set of characters represented by a sine wave having a DC shift.

The data capture circuit 110 receives a stream of signal sample data (DATA) 115 and a signal sample clock (CLK) 114 that is synchronous with the signal sample data 115. The signal sample data 115 and signal sample clock are provided by an analog to digital converter 111. The analog to digital converter receives an incoming signal 105 that is asynchronous to the sample clock 114. The incoming signal 105 represents words made up of characters, such as the sine wave 100 shown in FIG. 1. The analog to digital converter 111 takes amplitude samples of the incoming signal 105 and provides a digital representation of each amplitude sample as the signal sample data 115.

A character detection circuit 112 in the data capture circuit 110 is coupled to receive the signal sample clock 114 and signal sample data 115. The character detection circuit 112 provides character values (CV) on output 119 by performing an area detection operation on the incoming signal sample data 115. In providing the character values, the character detection circuit compensates for DC shifts in the signal 105 that are reflected in the in the sample data 115.

In embodiments of the present invention, the character detection circuit 112 also provides a servo bit output 117 and a peak value output 116. The servo bit output 117 is asserted when there is a positive peak differential sample of the sample data 115, and the peak value output 116 provides the peak differential amplitude of the sample data 115. The detection of a peak is particularly useful when the signal 105 is in gray code format. In a disk drive, gray code is employed in servo signal data that is maintained on the drive's recording medium and provides track location and other useful information.

A word detection circuit 113 in the data capture circuit 110 employs the character values generated by the character detection circuit 112 to provide word values (WV) on output 118. The word detection circuit 113 is coupled to receive the character detection circuit's character value output 119 and the signal sample clock 114. In providing the word values, the word detection circuit compensates for dropouts in the signal 105.

In one embodiment of the present invention, the data capture circuit 110 is employed in a disk drive for interpreting servo signals. The word value output 118, servo bit output 117, and peak value output 116 are coupled to a processing engine, such as a microprocessor or microcontroller in the disk drive. These values are then employed by the processing engine in controlling the operation of the drive. In such an embodiment, the analog to digital converter 111 is incorporated into the drive's read channel circuitry (not shown). In alternate embodiments of the present invention, the data capture circuit 110 is employed in environments other than a disk drive, such as a networking system.

Figure 4:
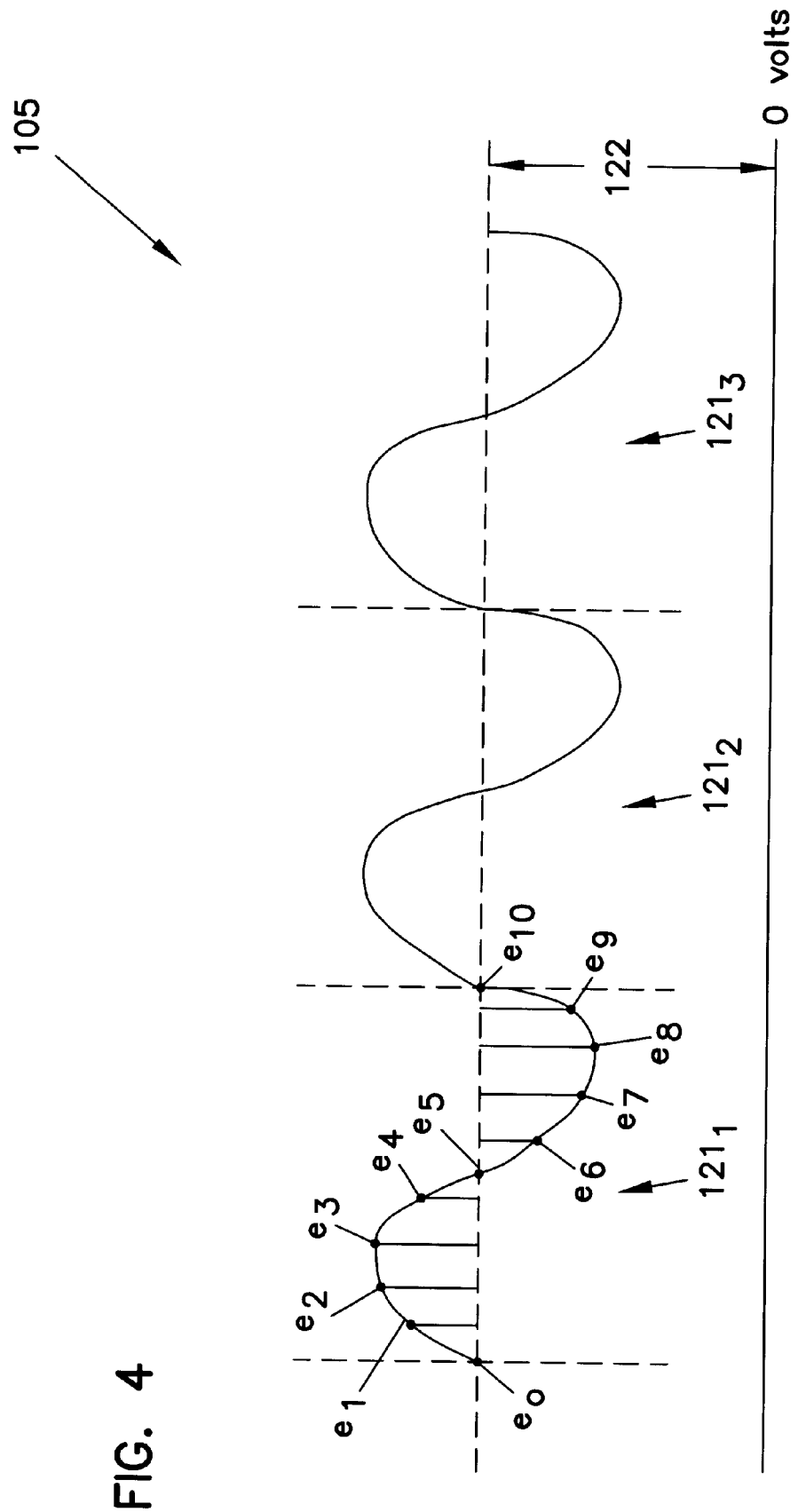
FIG. 4 illustrates the detection of a character value in accordance with the present invention.

FIG. 4 illustrates the operation performed by the character detection circuit 112 in providing a character value based on an incoming stream of sample data 115 taken from a signal 105. In FIG. 4, the incoming signal 105 is a sine wave with each cycle representing a character $121_{1-3}$. The signal 105 is experiencing a DC shift 122, which in a traditional character detection circuit would result in an inaccurate character value determination.

In FIG. 4 sample data points for the first cycle of an incoming signal 105 are represented by the letter "e" with a subscript. During the operation of the character detection circuit 112, the analog to digital converter 111 provides digital representations (115, FIG. 3) of each sample data point, for each character cycle $121_{1-3}$, along with a corresponding sample clock 114 (FIG. 3).

In accordance with the present invention, the character detection circuit 112 compensates for the DC shift by summing a set of differential samples of the signal 105. Each of the differential samples is an absolute value of a difference between two non-differential samples (e) of the signal 105 that are separated by a predetermined period of time.

In one embodiment of the present invention, the predetermined period of time is such that the subtraction of two non-differential samples spaced apart by the predetermined period of time is equal to twice the magnitude of any one of the non-differential samples less the component of the sample's magnitude contributed by the DC shift 122 in the signal 105. As a result, the summation of differential samples for a character cycle equals the area under the portion of the signal 105 that corresponds to the character. In such an embodiment, the predetermined period of time is equal to one half of an inverse of the signal 105 frequency.

For example, character $121_1$ is provided to the character detection circuit 112 as a set of sample data 115 (FIG. 3). This set of sample data includes L+1 sample data points ($e_0$–$e_L$), wherein L+1 is equal to the number of samples in a character. In the sine wave 105 shown in FIG. 4, L is equal to 10. In further embodiments of the present invention, L is in a range of 8 to 12.

The character detection circuit 112 calculates differential samples for character $121_1$ according to the following equation:

$$DS = e_K - e_{(K+N)}$$

wherein:

DS is a differential sample;

K is an integer; and

N is the number of samples that occur in a predetermined period of time.

In one embodiment of the present invention, N is equal to L divided by 2, so that the predetermined period of time is equal to one half of an inverse of the signal 105 frequency. In such an embodiment, a summation of the absolute value of differential samples for K being equal to 0 through L divided by 2 provides the area under the signal 105 that corresponds to character $121_1$. Accordingly, the character value for character $121_1$ is calculated according to the following equation:

$$CV = \sum_{K=0}^{K=\frac{L}{2}} |(e_K - e_{(K+N)})|$$

Figure 5:
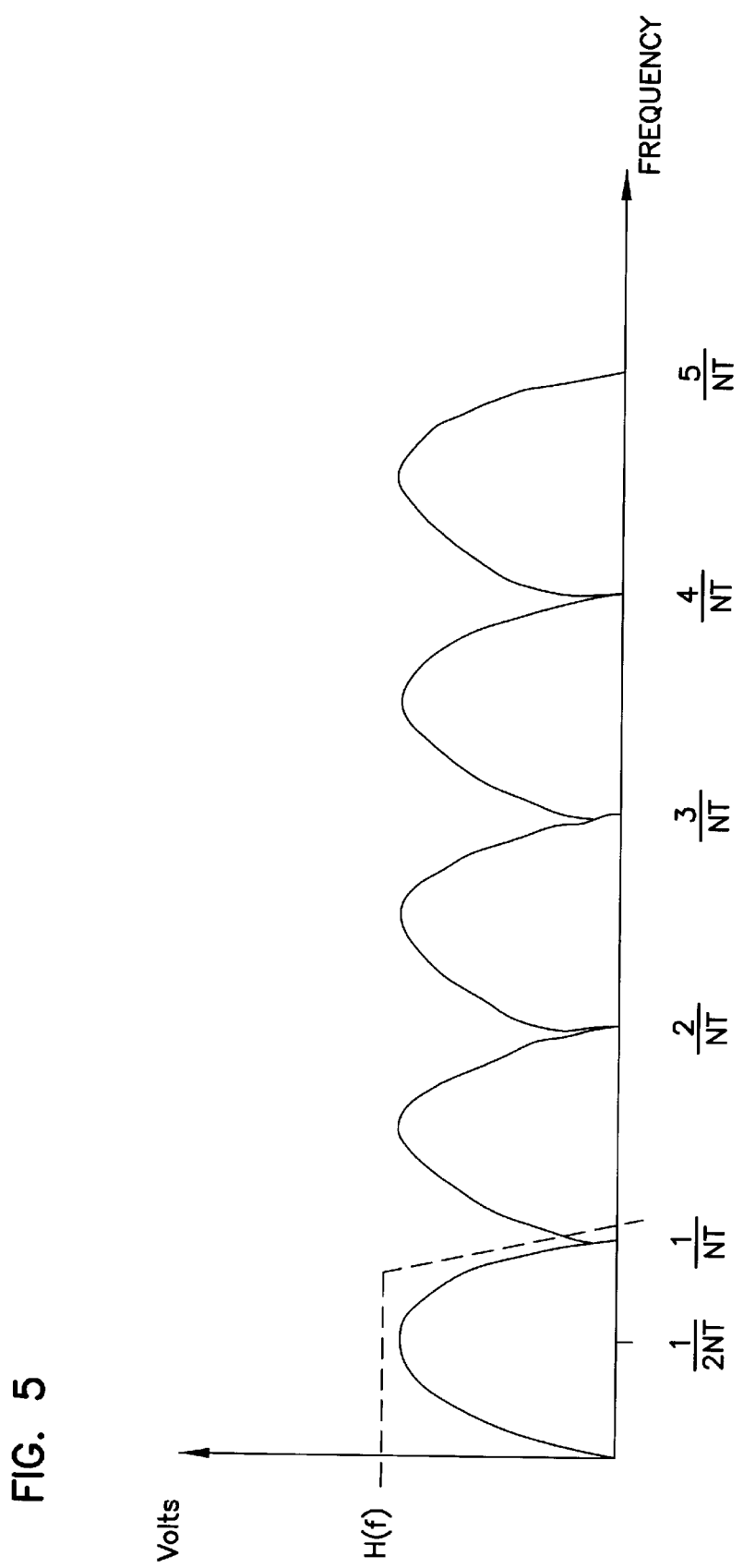
FIG. 5 illustrates a frequency response of a character detection circuit in accordance with the present invention.

FIG. 5 illustrates the frequency response of the character detection circuit 112. As shown in FIG. 5, the output of the character detection circuit 112 is maximized at the burst frequency (Frequency equal to 1/(2*N*T)), where T is the time between each sample in a character. The character detection circuit 112 has no magnitude response to a DC shift (Frequency equal 0 Hertz) or a second harmonic shift (Frequency equal to R/(N*T), where R is an integer). This is beneficial, since DC shifts and second harmonic shifts are inherent in magneto-resistive heads.

In operation in a disk drive, the frequency response of the character detection circuit 112 to frequencies in excess of the second harmonic are removed by a channel filter (not shown). The channel filter is employed in the drive's read channel circuitry. The effects of the channel filter are represented in FIG. 5 by the filter transfer function H(f).

Figure 6:
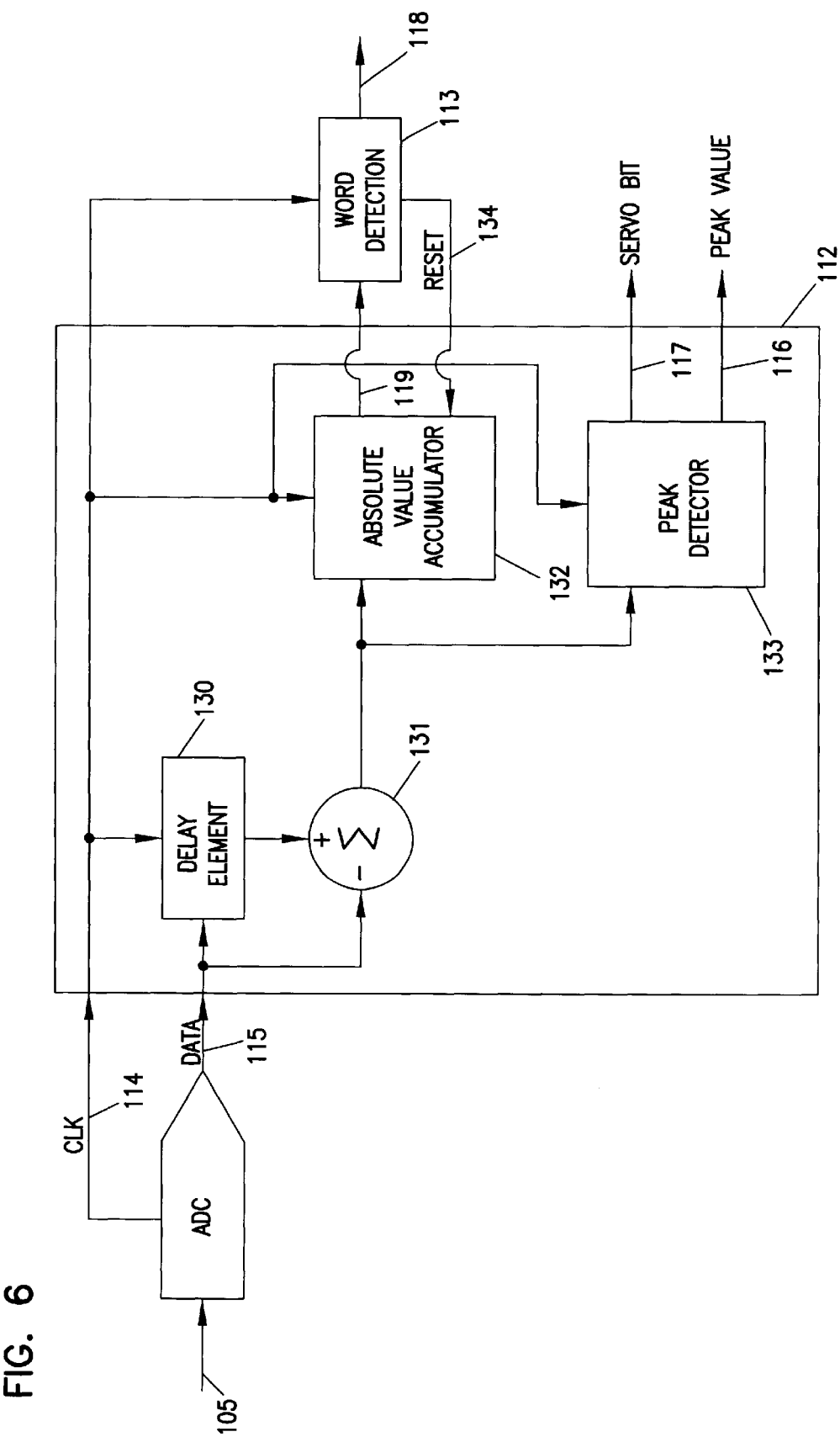
FIG. 6 illustrates a character detection circuit in accordance with the present invention.

FIG. 6 illustrates the character detection circuit 112 in one embodiment of the present invention. The signal sample data 115 and sample clock 114 are coupled to inputs of a delay element 130, which provides a delayed version of the sample data on an output. The delay element 130 output is coupled to a first input of a subtractor 131, which has a second input coupled to receive the sample data 115. The delay element 130 output provides the delayed data, so that it has been delayed for a predetermined period of time equal to one half of an inverse of the signal 105 frequency.

The subtractor 131 subtracts the present sample data 115 on the second input from the delayed sample data on the first input. The resulting difference is then provided on the output of the subtractor 131, which is coupled to a data input of an absolute value accumulator 132. The absolute value accumulator 132 is also coupled to the sample clock 114. The absolute value accumulator 132 accumulates the values that it receives from the subtractor 131 for a character. The resulting accumulation is the character's character value, which is provided on a character value output 119.

In order to reset the absolute value accumulator 132 for each character, the absolute value accumulator 132 is coupled to receive a reset signal 134 from the word detection circuit 113. The reset signal is asserted by the word detection circuit 113 after each character is completed. In an alternate embodiment of the present invention, the absolute value accumulator 132 includes circuitry to reset itself after each character is completed.

In order to provide the servo bit output 117 and peak value output 116, the character detection circuit 112 also includes a peak detector 133. The peak detector 133 is coupled to receive the sample clock 114 and the output of the subtractor 131. The peak detector 133 asserts the servo bit output 117 when the peak detector 133 detects a peak in the output of the subtractor 131. The peak is detected when the output of the subtractor 131 exceeds a predetermined threshold and the subtractor's present output value is less than the preceding output value of the subtractor 131.

When a peak is detected, the preceding output value of the subtractor 131 is provided on the peak value output 116. This value represents the peak differential sample value for the signal 105. By employing the output of the subtractor 131, the peak detector 133 eliminates the contribution of DC shifts to the peak value.

Figure 7A:
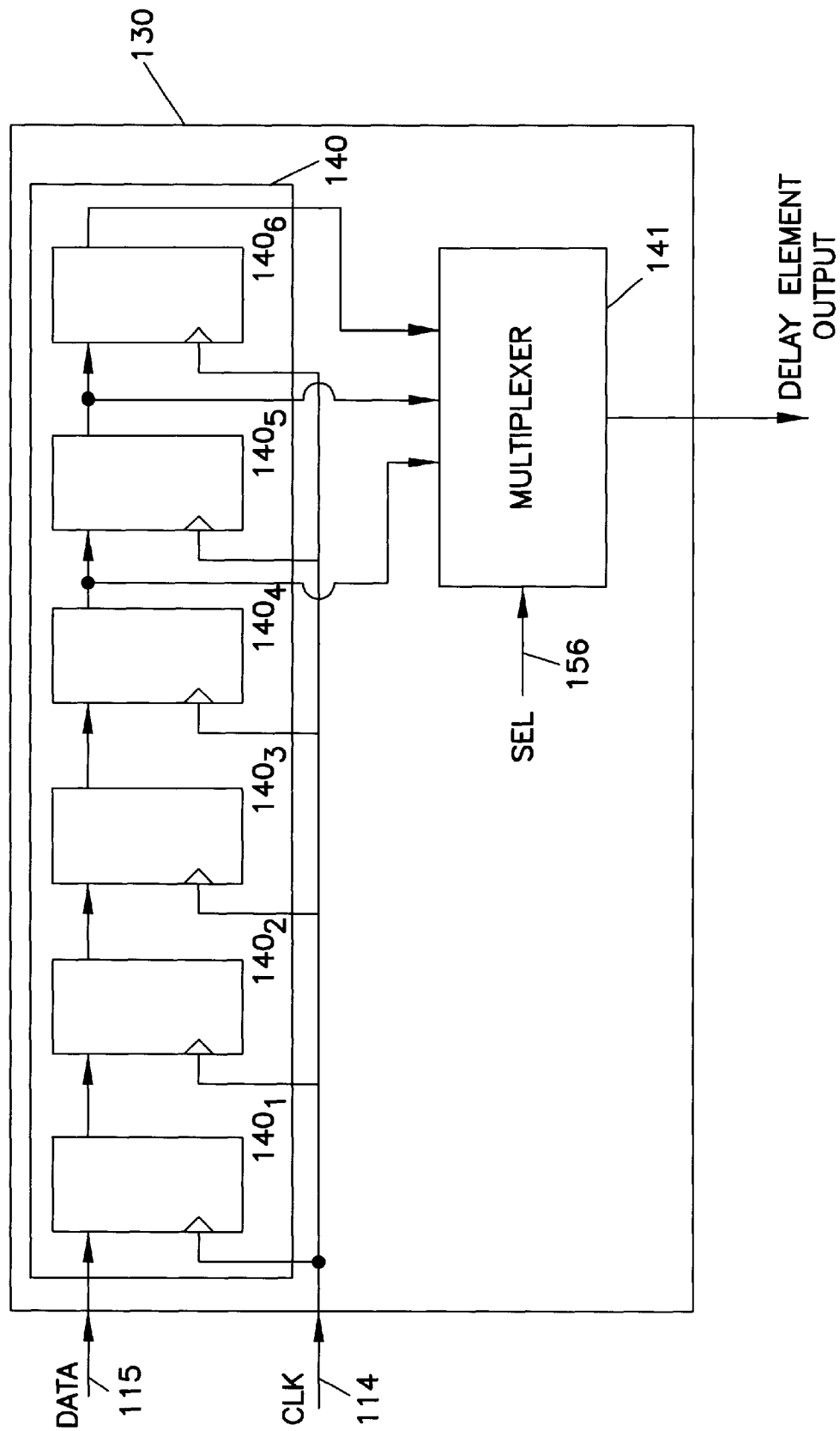
FIG. 7($a$) illustrates the delay element shown in FIG. 6 in one embodiment of the present invention.

FIG. 7(a) illustrates the delay element 130 in one embodiment of the present invention. The delay element 130 includes a shift register 140 and a multiplexer 141. The shift register 140 is made up by a set of registers $140_{1-6}$. Each of the registers $140_{1-6}$ has a clock input which is coupled to the sample clock 114. Each of the registers $140_{1-6}$ also has a data input and an output. The output of registers $140_1$, $140_2$, $140_3$, $140_4$, and $140_5$ are each coupled to the data input of register $140_2$, $140_3$, $140_4$, $140_5$, and $140_6$, respectively. The data input of register $140_1$ is coupled to receive the sample data 115.

In operation, each of the registers $140_{1-6}$ provides the value on its input as the value on its output when the clock input receives a rising edge. The outputs of registers $140_4$, $140_5$ and $140_6$ are each coupled to a respective data input of the multiplexer 141. The multiplexer also includes a selection input 156, which is employed to select one of the data inputs. The selected data input is then provided on the output of the multiplexer 141, which forms the output of the delay element 130. The multiplexer's selection input 156 allows the time delay of the sample data 115 to be adjusted. In one embodiment of the present invention, the selection input is set so that the delay is equal to one half of an inverse of the signal 105 frequency.

In one embodiment of the present invention, the sample data 115 and each of the data inputs and outputs of the registers $140_{1-6}$ and multiplexer 141 are six bits wide. In alternate embodiments of the present invention, a different number of bits can be employed for representing the sample data 115. In further embodiments of the present invention, a different number of registers can be employed in the delay element 130.

Figure 7B:
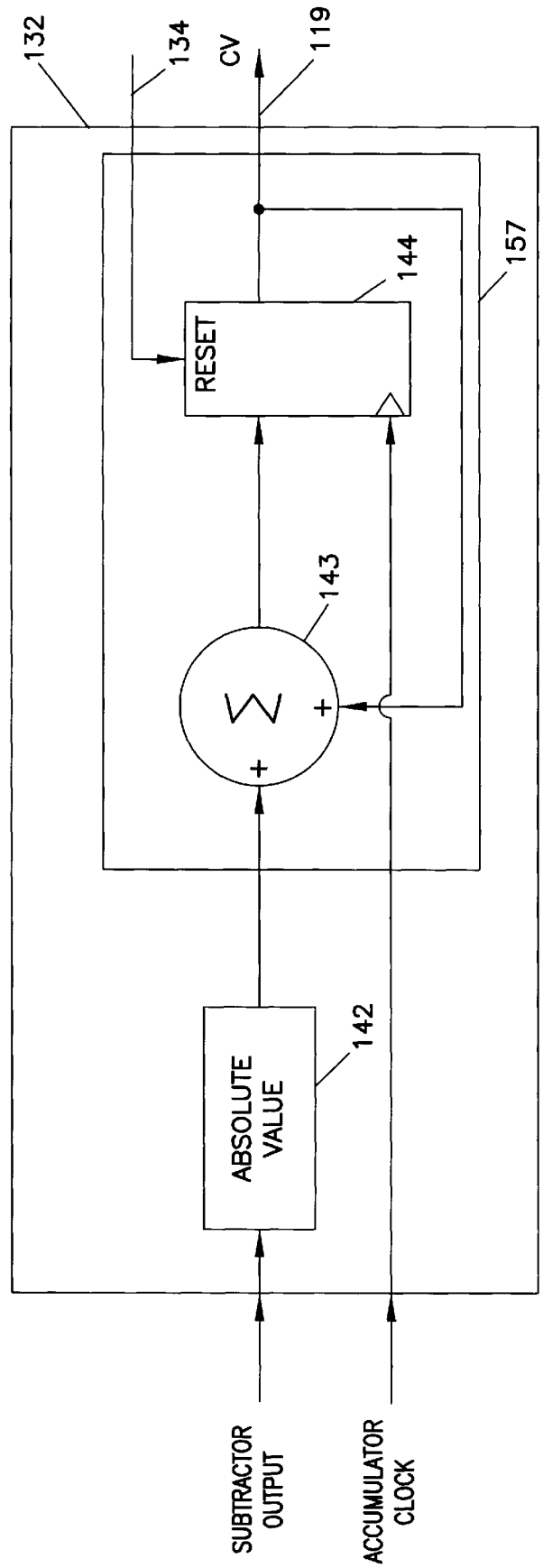

FIG. 7(b) illustrates the absolute value accumulator 132 (FIG. 6) in one embodiment of the present invention. The absolute value accumulator 132 includes an absolute value circuit 142 and an accumulator 157. The absolute value circuit 142 has an input forming the input to the absolute value accumulator 132 to receive the output of the subtractor 131. The absolute value circuit 142 provides the absolute value of the value received from the subtractor 131 on an output. The output of the absolute value circuit 142 is coupled to the input of the accumulator 157, which sums the values it receives to provide a character value on its output 119.

The accumulator 157 includes an adder 143 having a first input forming the input of the accumulator 157. The output of the adder 143 is coupled to a data input of a register 144 in the accumulator. The output of the register 144 provides the character value output 119 and is coupled to a second input of the adder 143. In operation, the adder 143 provides the sum of the values on its first input and second input on its output. The register 144 also includes a clock input which is coupled to receive an accumulator clock. In one embodiment of the present invention, the accumulator clock is synchronous with the sample clock 114 and has the same frequency as the sample clock 114. The output of the register 144 is set to equal the data input of the register 144 on a rising clock edge.

The register 144 also has a reset input, which is coupled to receive the reset signal 134 from the word detection circuit 113. When the reset input 134 is asserted, the register 144 is cleared. Such a reset is performed after the accumulation for an entire character, so that the register 144 will be clear when accumulating for a new character value.

Figure 7C:
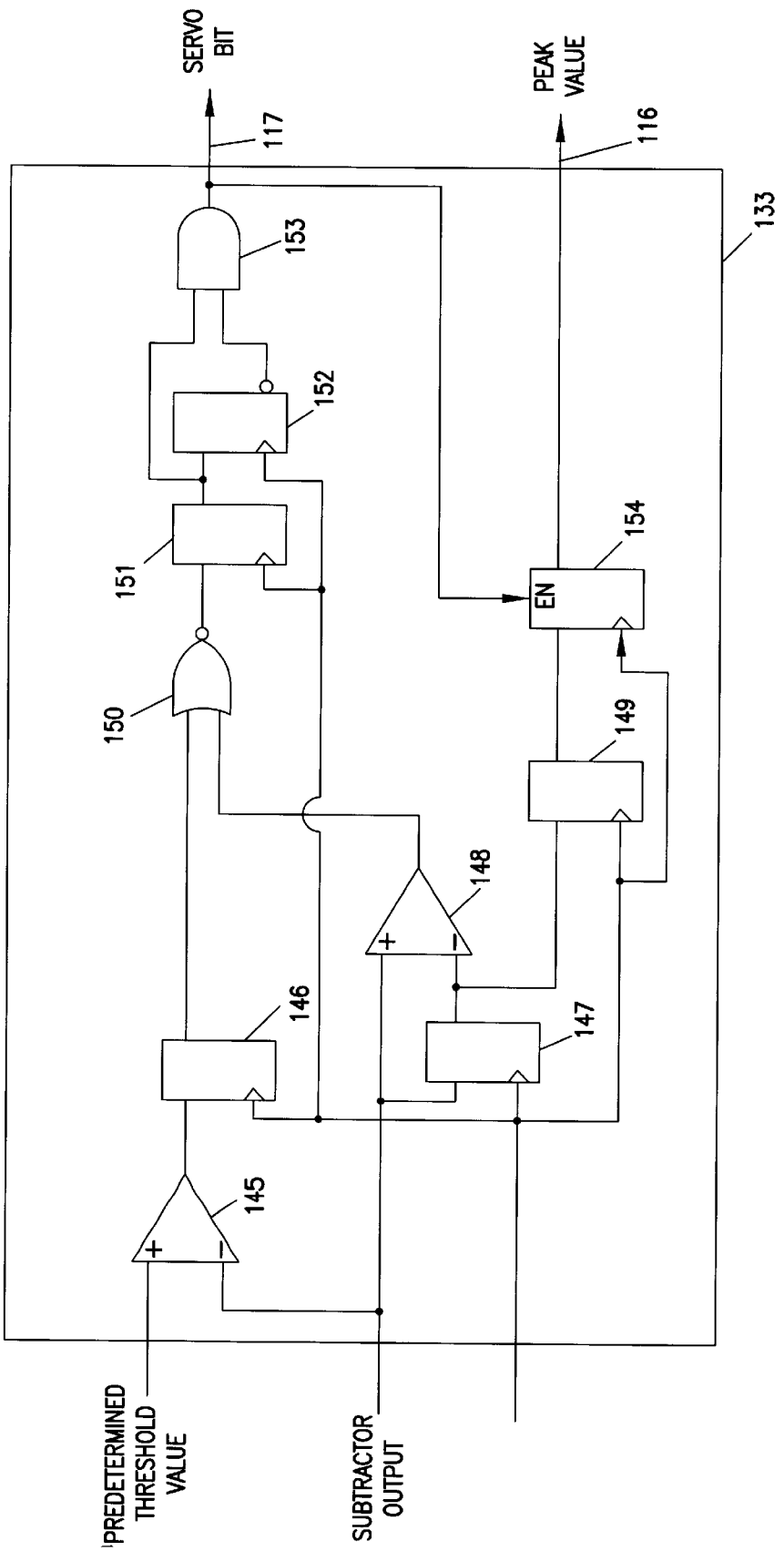

FIG. 7(c) illustrates one embodiment of the peak detector 133 in the character detection circuit 112. The peak detector 133 includes a comparator 145 having a first input coupled to the output of the subtractor 131 and a second input coupled to a predetermined threshold value. The output of the comparator 145 is asserted to a logic 0 when the output of the subtractor 131 exceeds the value of the predetermined threshold. Otherwise, the output of the comparator 145 is set to a logic 1.

The output of the comparator 145 is coupled to the data input of a register 146. The register 146 includes a clock input, which is coupled to the sample clock 114. The output of the register 146 is set to the value on the register's data input when the clock input receives a rising edge. The output of the register 146 is coupled to the first input of a nor gate 150. The nor gate 150 includes a second input which is coupled to the output of a comparator 148.

The comparator 148 has a first input coupled to the output of the subtractor 131 and a second input coupled to the output of a delay register 147. The delay register 147 has a data input coupled to the output of the subtractor 131 and a clock input coupled to the sample clock 114. The output of the delay register 147 is set to equal the data input of the delay register 147 on the rising edge of a clock signal. Accordingly, the comparator 148 has a first input receiving the present output of the subtractor and a second input receiving the preceding output of the subtractor.

The output of comparator 148 is asserted to a logic 0 when the present output of the subtractor 131 is less than the preceding output of the subtractor 131. Otherwise, the subtractor output is a logic 1. When the output of comparator 145 is asserted to a logic 0 and the output of comparator 148 is asserted to a logic 0, the output of the nor gate 150 is asserted to a logic 1. This indicates that there is a positive peak in the subtractor 131 output, since the present subtractor 131 output exceeds a predetermined threshold and the preceding subtractor 131 output is greater than the present subtractor output.

The output of the nor gate 150 is coupled to the data input of register 151, which has an output coupled to the input of data register 152 and the first input of an and gate 153. An inverse output of the register 152 is coupled to a second input of the and gate 153. Both register 151 and register 152 have a clock input coupled to the sample clock 114. The output of register 151 is set to equal the data input of register 151 at the rising edge of a clock signal. The inverse output of register 152 is set to equal the inverse of the data input of register 152 at the rising edge of a clock signal. The output of the and gate 153 forms the servo bit output 117. The servo bit output 117 is set for one sample clock cycle after the output of register 151 is asserted to a logic 1.

The output of the delay register 147 is also coupled to the data input of register 149, which has an output coupled to the data input of register 154. An output of register 154 forms the peak value output 116. Register 149 and register 154 each have a clock input which is coupled to the sample clock 114. The output of register 149 is set to equal the value on the data input of register 149 at a rising edge of a clock signal.

Register 154 also includes an enable input which is coupled to the output of the and gate 153. When the enable input to register 154 is asserted (logic value 1), the peak value output 116 is set to equal the data input of register 154 when the clock signal receives a rising edge. When the enable input is not asserted, the output of register 154 is not enabled. As a result, the peak value output 116 provides the peak differential sample value that is detected for a character at the same time that the servo bit output 117 is asserted.

One with ordinary skill in the art will recognize that the above implementations of the delay element 130, absolute value accumulator 132, and peak detector 133 only represent one embodiment of the present invention. In alternate embodiments of the present invention, these elements of the character detection circuit 112 can be designed in a number of different ways. In one embodiment of the present invention, the functionality of the character detection circuit 112 is achieved through the use of a microprocessor receiving the sample data 115 and executing instructions that are stored in a memory. In further embodiments of the present invention, the character detection circuit 112 includes either a peak detector 133 or an absolute value accumulator 132, instead of including both of these circuits.

As shown in FIG. 3, the word detection circuit 113 is coupled to the character value output 119 to receive character values for use in generating word values. In providing word values, the word detection circuit 113 detects and corrects dropouts in the character values that are provided. In one embodiment of the present invention, character value dropout is detected by comparing a value for character that is currently being received by the word detection circuit 113 with the value for a character value that is received by the word detection circuit 113 at another time.

If the current value for a character value is not at least as large as a predetermined percentage of the value for a character received at another time, then the word detection circuit 113 identifies the present character value as being distorted by dropout. The word detection circuit 113 then uses the character value from another time in place of the current character value.

In one embodiment of the present invention, the value for a character received at another time is received prior to the reception of the current value. In an alternate embodiment of the present invention, the value for a character received at another time is received subsequent to the reception of the current value. In yet another embodiment of the present invention, both of the above-described dropout detection and correction techniques are employed by the word detection circuit 113. In such an embodiment, both the first and last character value being employed to determine a word value can be checked for dropout.

In one embodiment of the present invention, the data capture circuit 110 is employed in a disk drive for interpreting servo signals. In servo signal words, all of the characters in a word typically have the same character values. Accordingly, the substitution of one character value in a word for a character value that is suffering from dropout will result in a proper word value being calculated.

Figure 8:
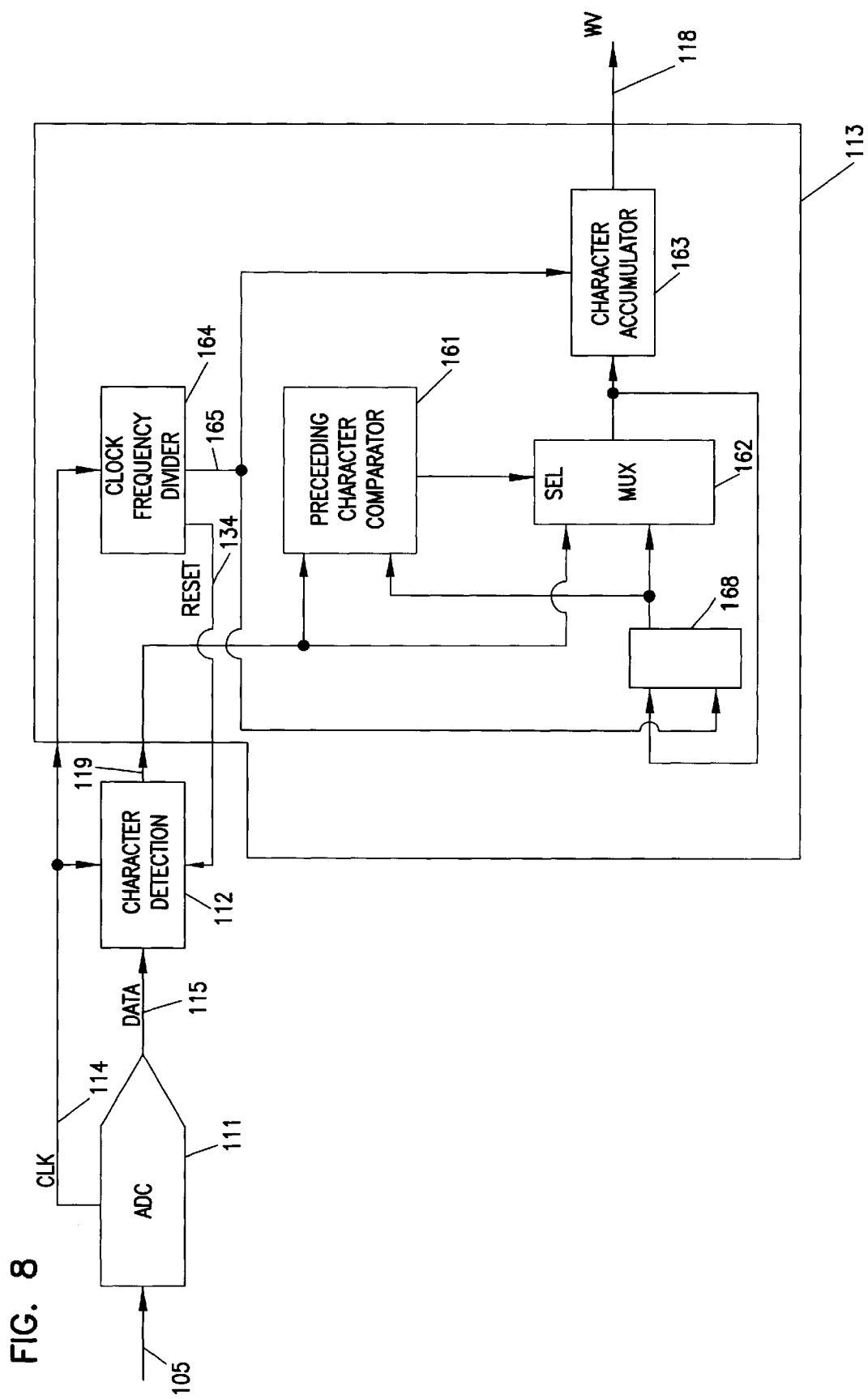
FIG. 8 illustrates a word detection circuit in accordance with the present invention.

FIG. 8 illustrates the word detection circuit 113 in one embodiment of the present invention. The word detection circuit 113 includes a clock frequency divider 164 which is coupled to receive the sample clock 114 and provide a character clock on output 165. The character clock has a frequency equal to the inverse of a character period. When the character period is one cycle of the signal 105, then the character frequency is equal to the frequency of the signal 105.

The clock divider 164 also provides the reset signal 134 that is coupled to the absolute value accumulator 132 in the character detection circuit 112. The reset signal 134 is asserted after each cycle of the character clock. Accordingly, the reset 134 is set after each character is received from the character detection circuit 112.

The word detection circuit 113 shown in FIG. 8 also includes a preceding character comparator 161, multiplexer 162, register 168, and character accumulator 163. The character value output of the character detection circuit 112 is coupled to a first input of the preceding character comparator 161 and a first data input of the multiplexer 162. The second input of the preceding character comparator 161 and the second data input of the multiplexer 162 are coupled to the output of the register 168.

The data input of the register 168 is coupled to the output of the multiplexer 162, and the clock input of the register 168 is coupled to the clock frequency divider 164 output 165. The output of the register 168 is set to the value on the data input of the register 168 at the rising edge of a clock signal.

In operation, the configuration of the preceding character comparator 161, multiplexer 162, and register 168 provide for the first inputs of the preceding character comparator 161 and multiplexer 162 to contain the current value for a character. The second inputs of the preceding character comparator 161 and multiplexer 162 contain a valid value for a character that preceded the current value.

The output of the preceding character comparator 161 is coupled to a selection input of the multiplexer 162. The output of the preceding character comparator is asserted to select the first input of the multiplexer 162, when the current value for a character is not less than a predetermined percentage of the previously received valid value for a character. Otherwise, the output of the preceding character comparator selects the second input of the multiplexer 162. In one embodiment of the present invention, the predetermined percentage is 50%.

The selected multiplexer 162 input is provided on the output of the multiplexer 162. As a result, the output of the multiplexer 162 always contains a valid character value. Since the register 168 data input is coupled to the multiplexer 162 output, the output of the register 168 always contains the last valid character value provided to the word detection circuit 113.

The output of the multiplexer 162 is coupled to an input of the character accumulator 163. The character accumulator 163 includes a clock input that is coupled to receive the output 165 of the clock frequency divider 164. The character accumulator 163 accumulates character values that are received from the multiplexer 162 output to form a word value. The word value is then provided on the output of the accumulator 163 which forms the word value output 118 of the word detection circuit 113.

Figure 9A:
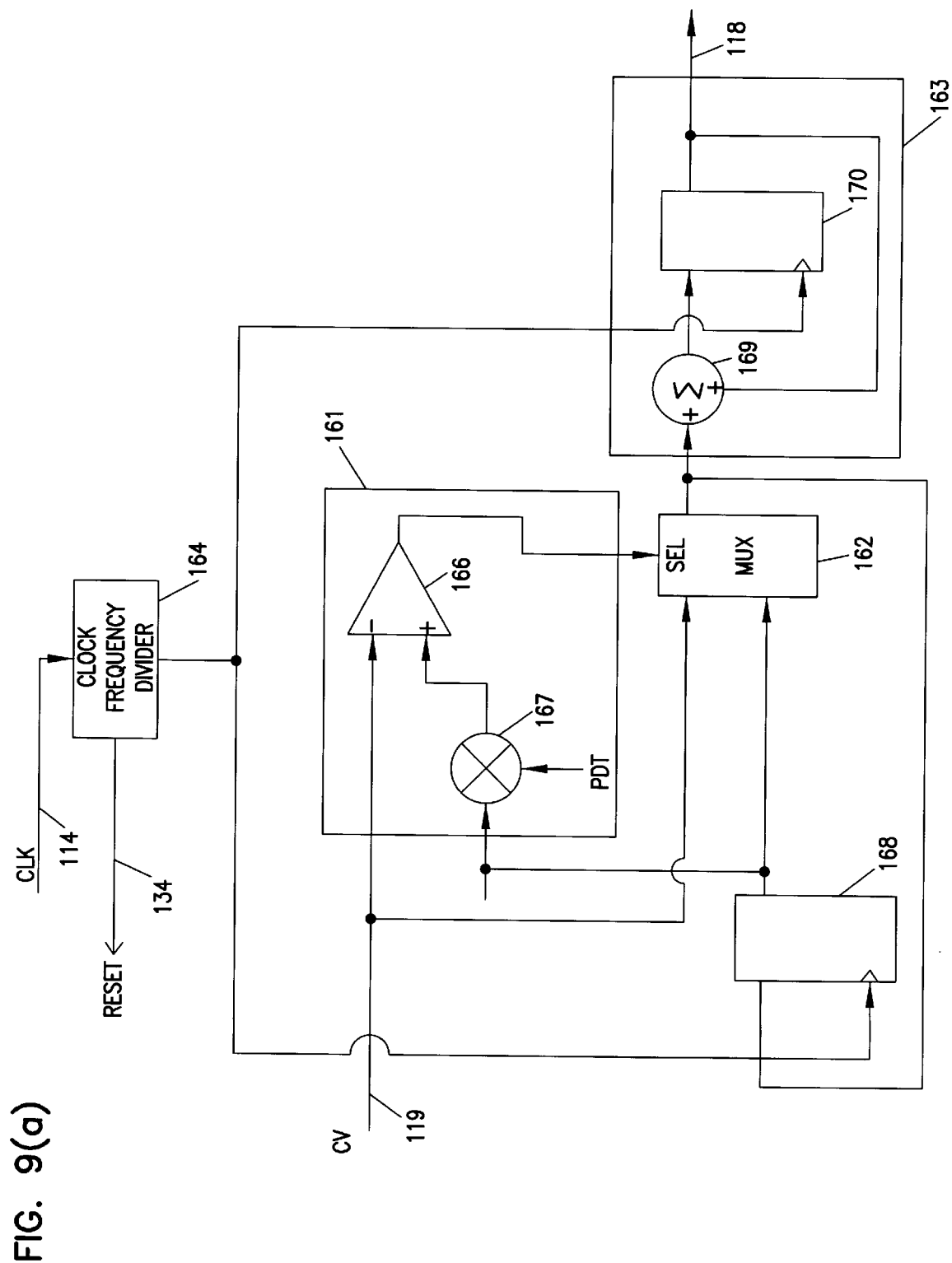
FIG. 9($a$) illustrates a word detection circuit in one embodiment of the present invention.
FIG. 9(b) illustrates a word detection circuit in an alternate embodiment of the present invention.

FIG. 9(a) illustrates the word detection circuit 113 from FIG. 8 in more detail. As show in FIG. 9(a), the preceding character comparator 161 includes a comparator 166 and a multiplier 167. The comparator 166 has a first input forming the first input of the preceding character comparator 161, which is coupled to receive character values from the character detection circuit 112. A second input of the comparator 166 is coupled to an output of the multiplier 167.

The multiplier 167 has a first input coupled to receive a predetermined dropout threshold (PDT) and a second input forming the second input of the preceding character comparator 161. The value provided on the output of the multiplier 167 is the last valid character value multiplied by the predetermined dropout threshold. The predetermined dropout threshold is the predetermined percentage by which the last valid character value is multiplied before being compared with the present character value.

The output of comparator 166 forms the output of the preceding character comparator 161. The output of comparator 166 is asserted to select the second input of the multiplexer 162 when the present character value being received on the comparator's first input is less than the output of the multiplier 167. Otherwise, the comparator 166 output is asserted to select the first output of the multiplexer 162.

As shown in FIG. 9(a), the character accumulator 163 is formed by an adder 169 and a register 170. The adder 169 has a first data input forming the input of the accumulator 163, which is coupled to the output of the multiplexer 162. The adder 169 also has a second input, which is coupled to the output of the register 170. The register has a data input coupled to receive an output of the adder 169 and a clock input coupled to receive the output 165 of the clock frequency divider 164. On the rising edge of a clock the data input of the register 170 is passed to the data output of the register 170.

The adder 169 and register 170 operate together to accumulate character values provided at the output of the multiplexer 162 to generate a word value. The word value is provided on the output of the register 170, which forms the word value output 118 of the word detection circuit 113. The register 170 also receives a reset signal (not shown) after each word value is accumulated. In one embodiment of the present invention, this reset signal is provided by the clock frequency divider 164 after all the character values for a word are received by the word detection circuit 113 and accumulated.

Figure 9B:
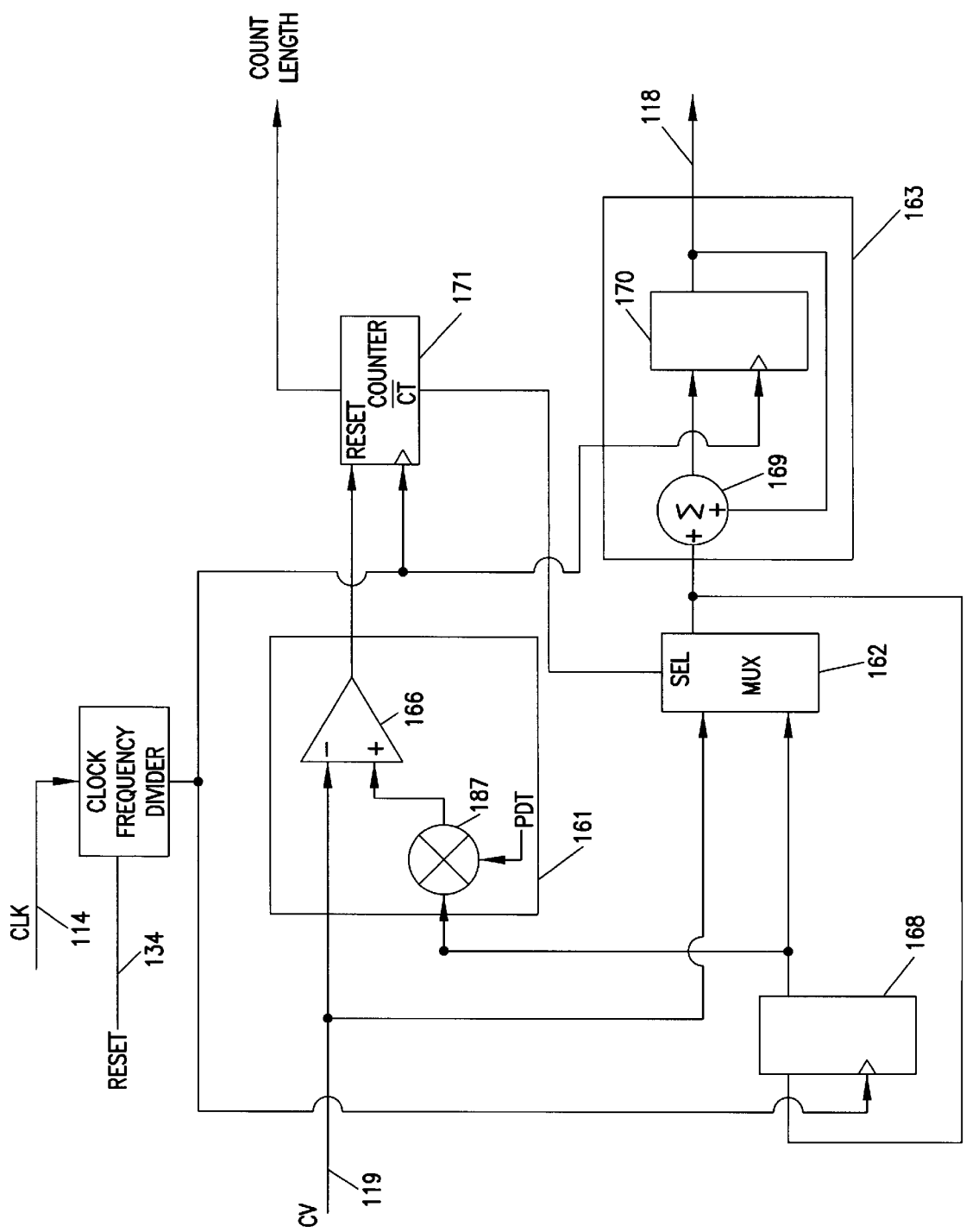

FIG. 9(b) shows the word detection circuit 113 in an alternate embodiment of the present invention. In FIG. 9(b), the word detection circuit also includes a counter 171. The counter 171 has a reset input coupled to the output of the comparator 166 and a clock input coupled to receive the output 165 of the clock frequency divider 164. The counter 171 also includes a counting output, which is coupled to the select signal of the multiplier 162, in place of the output of the comparator 166.

In operation, the counter 171 begins counting when the output of the comparator 166 is asserted to indicate that the second input of the multiplexer 162 is to be selected. Each count of the counter 171 occurs at the rising edge of a clock signal. When the counter 171 is counting, the counting output, which is coupled to the selection input of the multiplexer 162, is asserted to select the second input of the multiplexer 162. Otherwise, the counting output selects the first input of the multiplexer 162. As a result, the multiplexer 162 operates the same as if its selection signal were coupled directly to the output of the comparator 166.

The count value of the counter 171 is provided on a count length output. The count length output can be monitored by a control system to determine the number of dropouts that have been detected. When the number of dropouts exceeds a predetermined threshold, there may be a significant problem in the operation of the overall data capture system in which the data capture circuit 110 is employed. Accordingly, the control system can take an appropriate action or inform the user, if the counter value exceeds the predetermined threshold.

Figure 10:
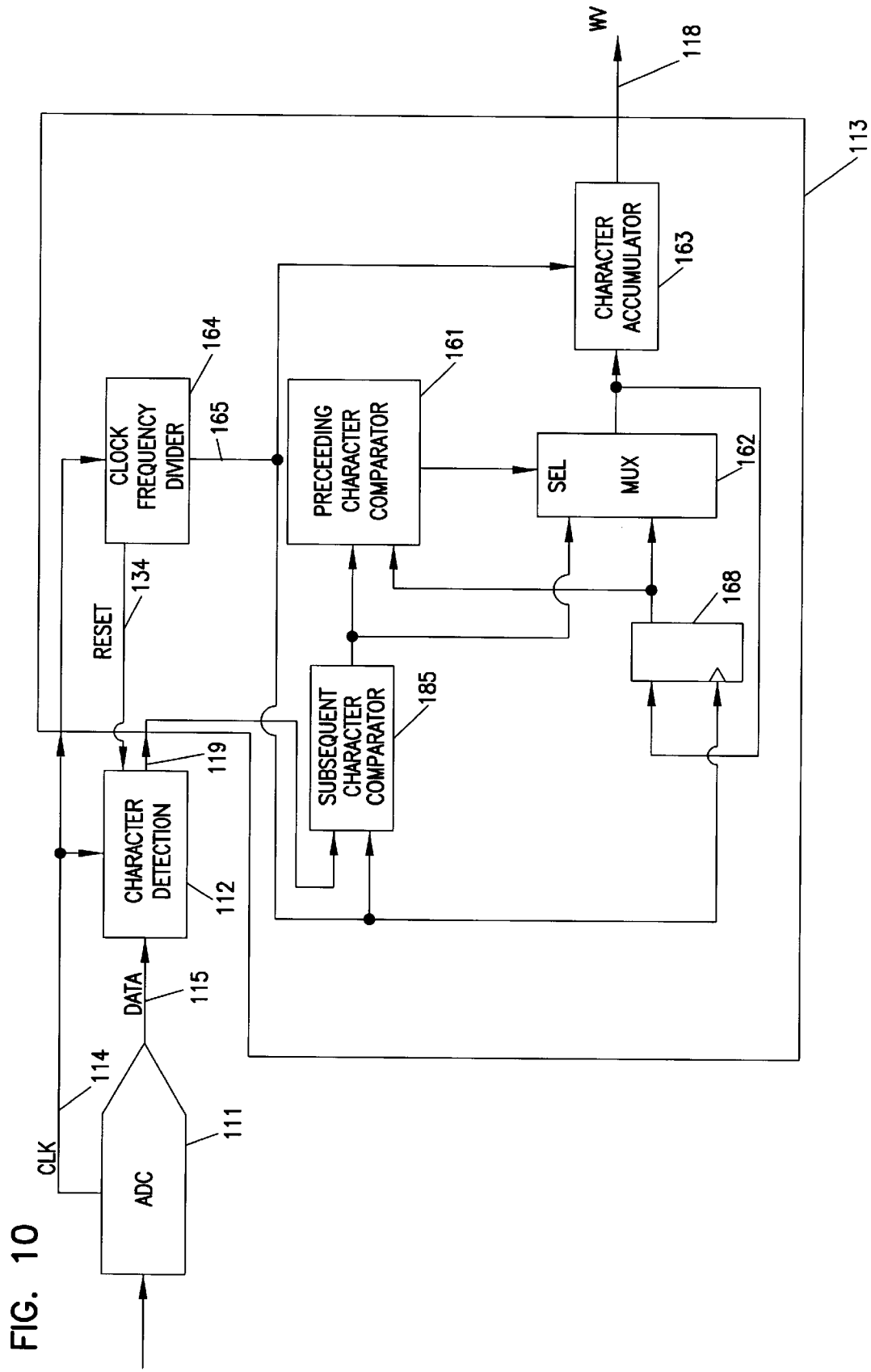
FIG. 10 illustrates a word detection circuit in an alternate embodiment of the present invention.

FIG. 10 illustrates another embodiment of the word detection circuit 113 in accordance with the present invention. In this embodiment, the word detection circuit 113 includes a subsequent character comparator 185. The subsequent character comparator 185 provides for determining whether there is a dropout in the first character of a word value. Such a determination cannot be made by the word detection circuit 113 shown in FIG. 8, since the preceding character comparator 161 will not detect dropout in the first character value.

The subsequent character comparator 185 has a data input coupled to receive the output of the character detection circuit 112 and a clock input coupled to receive the output 165 of the clock frequency divider 164. An output of the subsequent character comparator 185 is coupled to the first data input of the preceding character comparator 161 and the first data input of the multiplexer. The preceding character comparator 161, multiplexer 162, clock frequency divider 164, register 168, and character accumulator 163 operate the same as described above with reference to FIG. 8.

The subsequent character comparator 185 receives a character value and stores the character value for a predetermined period of time. After the predetermined period of time has elapsed, the subsequent character comparator 185 compares the stored character value with a newly received character value from the character detection circuit 112. If the stored character value is less than a predetermined percentage of the newly received character value, then the newly received character value is provided to the preceding character comparator 161 instead of the stored character value. As a result, word value errors due to dropout in the initial character of a word will be eliminated. In one embodiment of the present invention, the predetermined percentage is 50%.

Figure 11:
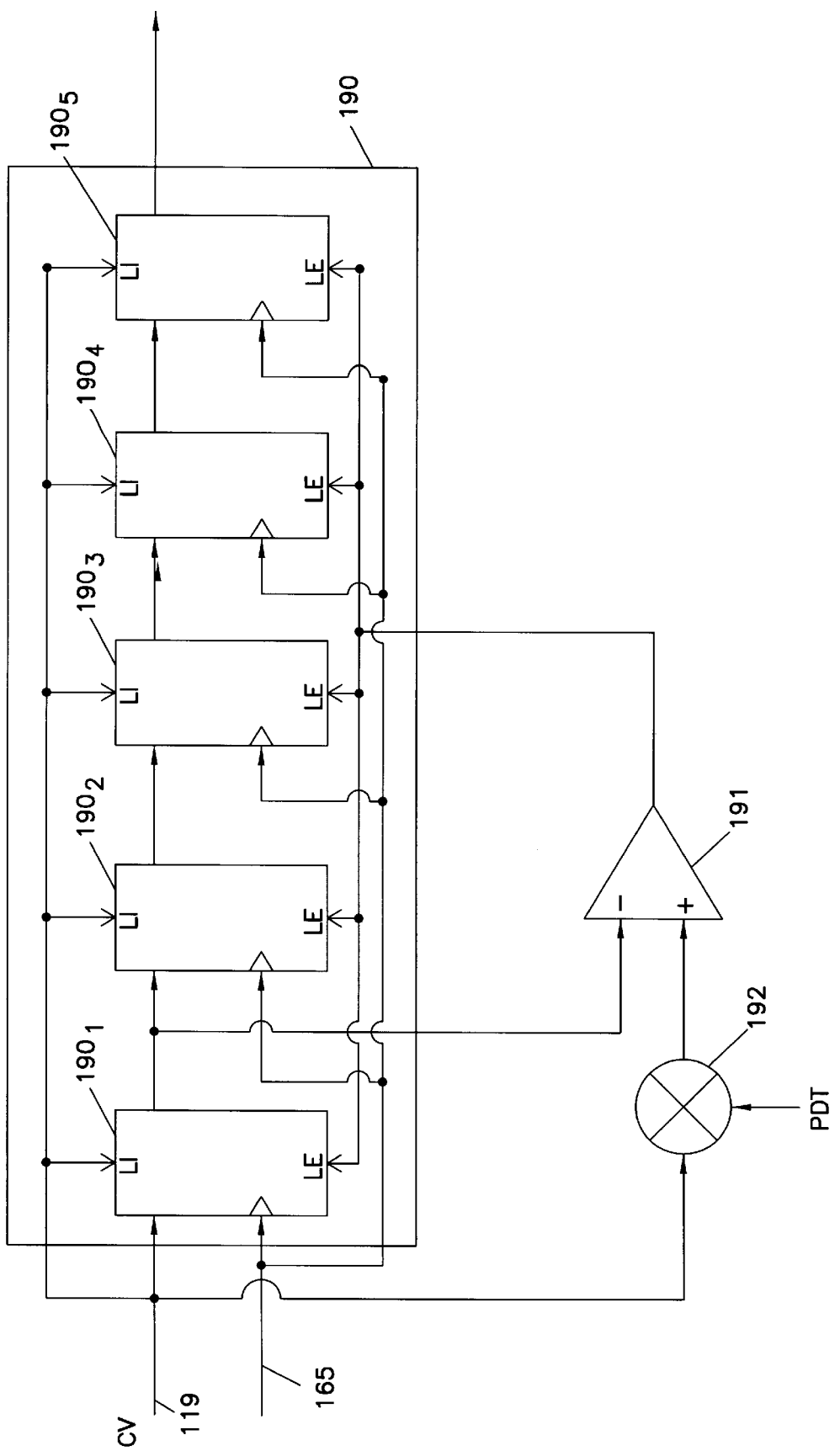
FIG. 11 illustrates the subsequent character comparator shown in FIG. 10.

FIG. 11 illustrates the subsequent character comparator 185 in more detail in one embodiment of the present invention. The subsequent character comparator 185 includes a multiplier 192, a comparator 191, and a delay element 190 containing a set of registers $190_{1-5}$. The set of registers $190_{1-5}$ provide for storing character values. Each register $190_{1-5}$ has a load input (LI) that is coupled to the character value output 119 of the character detection circuit 112. Each register $190_{1-5}$ also includes a load enable input that is coupled to the output of the comparator 191 and a clock input that is coupled to the output 165 of the clock frequency divider 164.

A data input of register $190_1$ is coupled to the character value output 119 of the character detection circuit 112. An output of register $190_1$ is coupled to a data input of register $190_2$, which has an output coupled to the data input of register $190_3$. Register $190_3$ has an output coupled to the data input of register $190_4$, which has an output coupled to a data input of register $190_5$. The output of register $190_5$ forms the output of the subsequent character comparator 185 that is coupled to the preceding character comparator 161 and multiplexer 162.

The comparator 191 has a first input coupled to an output of the multiplier 192 and a second input coupled to the output of register $190_1$. The multiplier 192 has a first input coupled to the character value output 119 of the character detection circuit 112 and a second input coupled to the predetermined dropout threshold. The output of the multiplier 192 provides a value equal to the character value provided by the character detection circuit 112 multiplied by the predetermined dropout threshold.

The output of the comparator 191 is asserted when the value on its second input is less than the value on its first input. As a result, the output of the comparator 191 is asserted when a previously received character value, which is stored in register $190_1$, is less than the a predetermined percentage of the present character value. The predetermined dropout threshold is equal to the predetermined percentage.

When the output of the comparator 191 is asserted, the load enable input for each of the registers $190_{1-5}$ is asserted. As a result, the output of each of the registers $190_{1-5}$ is set to the present character value. If the output of the comparator 191 is not asserted, each of the registers $190_{1-5}$ provides the value on its data input to its output upon receiving a rising clock edge.

In order to provide for the accurate detection of a word value, the output of register $190_5$ is not enabled until four character clock cycles after the first character value of a word is received by register $190_1$. This prevents values loaded into register $190_5$ from being passed to the preceding character comparator 161 prior to the first character value in a word being passed. In one embodiment of the present invention, this is achieved by register $190_5$ having a tri-state output, which is not enabled until four character clocks after the first character value is received by register $190_1$. When the output of register $190_5$ is not enabled, it is pulled to ground by a pull-down resistor (not shown).

The use of five registers $190_{1-5}$ in the delay element 190 provides for obtaining a correct word value, even if the first four characters in a word are corrupted by dropout. The use of more or less registers in the delay element 190 changes the tolerance of the word detection circuit 113 for correcting distorted characters at the start of a word.

In alternate embodiments of the present invention (not shown), the word detection circuit 113 includes the subsequent character comparator 185 and does not include the preceding character comparator 161, register 168, and multiplexer 162. In such an embodiment, the output of the subsequent character comparator 185 is coupled to the input of the character accumulator 163. The subsequent character comparator 185 will provide for the detection and correction of dropout in all character values, except the character value for the last character to be used in generating a word value. In yet another embodiment of the present invention, the functionality of the word detection circuit 113 is achieved through the use of a microprocessor receiving the character values and executing instructions that are stored in a memory.

Although the invention has been described above with particularity, this was merely to teach one of ordinary skill in the art how to make and use the invention. Many modifications will fall within the scope of the invention, as that scope is defined by the following claims.

What is claimed is:

1. A data capture circuit for determining a word value based on a signal having a frequency, said apparatus comprising:
   a means for providing a character value based on a comparison of a first accumulation of differential samples of said signal to a second accumulation of differential samples of said signal; and
   an accumulator having an input coupled to receive character values from said means for providing a character value and an output for providing a summation of character values received by said accumulator.

2. A data capture circuit comprising:
   a character detection circuit for determining values for characters represented by a signal having a frequency, said values for characters being based on an accumulation of differential samples of the signal; and
   a word detection circuit coupled to receive said values for characters from said character detection circuit and determine a word value based on said values for characters, wherein said word detection circuit includes:
      a comparison circuit for comparing a value for a character in a word to a value for at least one other character in the word and providing a character value based on said comparison, and
      an accumulator having an input coupled to receive character values from said comparison circuit and provide a summation of character values received by said accumulator.

3. A method for determining a word value for a signal having a frequency and representing a word, said method comprising the steps of:

(a) accumulating differential samples of said signal to obtain a summation value for a character in said word;

(b) comparing a summation value for a character in a word to a summation value for at least one other character in the word; and (c) providing a character value based on said comparison in said step (b).

4. A character detection circuit for determining a character value for a signal having a frequency, said character detection circuit comprising:

a delay element having an input for receiving sample values derived from the signal and an output adapted for providing a sample value received on said input after a predetermined period of time; and a subtractor having a first input coupled to said output of said delay element, a second input coupled to said input of said delay element, and an output adapted for providing a difference between a value provided to said first input and a value provided to said second input.

5. The character detection circuit of claim 4, further including:

an absolute value accumulator having an input coupled to said output of said subtractor for receiving said differences and an output adapted for providing a summation of absolute values of differences received by said input of said absolute value accumulator.

6. The character detection circuit of claim 4, further including:

a peak detector having an input coupled to the output of said subtractor and a servo bit output adapted for signaling a positive peak value on the output of said subtractor based on said differences provided by said subtractor.

7. The character detection circuit of claim 4, wherein said delay element includes:

a shift register having an input forming the input of said delay element and a first output for providing a value received on the input of said shift register after a first predetermined period of time, wherein said shift register further includes a second output for providing a value received on the input of said shift register after a second predetermined period of time, said delay element further including:

a multiplexer having a first input coupled to the first output of said shift register, a second input coupled to the second output of said shift register, a select input, and an output for providing said sample value received on said input of said delay element after a predetermined period of time in response to a signal on the select input.

8. A method for determining a character value for a signal having a frequency, said method comprising the steps of:

(a) obtaining a set of differential samples of said signal, wherein each differential sample in said set of differential samples is an absolute value of a difference between a first sample of said signal and a second sample of said signal, wherein said first sample is separated from said second sample by a predetermined period of time; and (b) accumulating differential samples in said set of differential samples to obtain a character value.

9. The method of claim 8, wherein said step (a) includes the steps of:

obtaining a first plurality of samples of the signal;

obtaining a second plurality of samples of the signal, wherein each sample in said second plurality of samples is spaced apart from a respective sample in said first plurality of samples by said predetermined period of time, wherein said predetermined period of time is equal to one half of an inverse of said frequency;

subtracting each sample in said second plurality of signals from a respective sample in said first plurality of samples to obtain a plurality of differences; and obtaining an absolute value of each difference in said plurality of differences to obtain a plurality of absolute differences.

10. A word detection circuit for determining a word value, said word detection circuit comprising:

a character comparator having a first input adapted for receiving values of characters in a series of characters, a second input, and an output adapted for indicating whether a value on said first input is less than a predetermined percentage of a value on said second input of said character comparator;

a multiplexer having a first input coupled to said first input of said character comparator, a second input, an output, and a select input coupled to said output of said character comparator; and a register having an input coupled to said output of said multiplexer and an output coupled to said second input of said multiplexer and said second input of said character comparator, said output of said register being adapted for providing a value from said input of said register after a predetermined period of time.

11. The word detection circuit of claim 10, wherein said character comparator includes:

a comparator having a first input forming said first input of said character comparator, a second input, and an output forming said output of said character comparator, wherein said output of said comparator is adapted for indicating whether a value on said first input of said comparator is less than a value on said second input of said comparator; and a multiplier having an input coupled to said output of said multiplexer and an output coupled to said second input of said comparator, said multiplier being adapted for providing a comparison value on said output of said multiplier, wherein said comparison value is equal to a value provided on said input of said multiplier multiplied by said predetermined percentage.

12. The word detection circuit of claim 10, further including:

a counter coupling the output of said character comparator to the select input of said multiplexer, said counter including a reset input coupled to the output of said character comparator, a count length input/output, and a counting output coupled to the select input of said multiplexer, wherein said counter counts when the reset input is not asserted and the counting output is asserted when said counter counts.

13. The word detection circuit of claim 10, further including:

an accumulator having an input coupled to the output of said multiplexer and an output for providing a summation of values provided to said input of said accumulator.

14. A word detection circuit for determining a word value, said word detection circuit comprising:

a delay element having a data input for receiving a value for a character, a first output adapted for providing a value received on said data input after a first predetermined period of time, a second output adapted for providing a value received on said data input after a second predetermined period of time, a load input coupled to said data input, and a load enable input, wherein asserting said load enable input causes a value on said load input to be provided on said second output; and a comparison circuit having a first input coupled to said data input of said delay element, a second input coupled to said first output of said delay element, and an output coupled to said load enable, said output being adapted for indicated whether a value on said second input of said comparison circuit is less than a predetermined percentage of a value on said first input of said comparison circuit.

15. The word detection circuit of claim 14, wherein said comparison circuit includes:

a comparator having a first input, a second input forming said second input of said comparison circuit, and an output forming said output of said comparison circuit, wherein said output of said comparator is adapted for indicating whether a value on said second input of said comparator is less than a value on said first input of said comparator; and a multiplier having an input forming said first input of said comparison circuit and an output coupled to said first input of said comparator, said multiplier being adapted for providing a comparison value on said output of said multiplication circuit, wherein said comparison value is equal to a value provided on said input of said multiplier multiplied by said predetermined percentage.

16. The word detection circuit of claim 14 further including:

a character comparator having a first input coupled to the second output of said delay element for receiving values of characters in a series of characters, a second input, and an output adapted for indicating whether a value on said first input is less than a second predetermined percentage of a value on said second input of said character comparator;

a multiplexer having a first input coupled to said first input of said character comparator, a second input, an output, and a select input coupled to said output of said character comparator; and a register having an input coupled to said output of said multiplexer and an output coupled to said second input of said multiplexer and said second input of said character comparator, said output of said register being adapted for providing a value from said input of said register after a predetermined period of time.

17. A method for determining a word value, said method comprising the steps of:

(a) comparing a value for a character in a word to a value for at least one other character in the word; and (b) providing a character value based on said comparison in said step (a); and (c) accumulating character values provided by said step (b) to obtain said word value.

18. The method of claim 17, wherein said step (a) includes the step of:

comparing a value for a character in a word to a value for a preceding character in the word, wherein the character value provided in said step (b) is the value for the preceding character if said comparison in said step (a) indicates that the value for the character is less than a predetermined percentage of the value for the preceding character.

19. The method of claim 17, wherein said step (a) further includes the step of:

comparing the value for the character in the word to value for a subsequent character in the word, wherein the character value provided in said step (b) is the value for the subsequent character if said comparison in said step (a) indicates that the value for the character is less than a predetermined percentage of the value for the subsequent character.

20. The method of claim 19, wherein said step (a) further includes the step of:

comparing the value for the character in the word to value for a preceding character in the word.

* * * * *